(12) United States Patent
Tokioka et al.

(10) Patent No.: US 9,711,669 B2
(45) Date of Patent: Jul. 18, 2017

(54) THIN-FILM PHOTOELECTRIC CONVERTER

(75) Inventors: Hidetada Tokioka, Tokyo (JP); Hiroya Yamarin, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1337 days.

(21) Appl. No.: 12/997,027

(22) PCT Filed: Jun. 3, 2009

(86) PCT No.: PCT/JP2009/060169
§ 371 (c)(1),
(2), (4) Date: Dec. 9, 2010

(87) PCT Pub. No.: WO2009/150980
PCT Pub. Date: Dec. 17, 2009

(65) Prior Publication Data
US 2011/0079272 A1 Apr. 7, 2011

(30) Foreign Application Priority Data
Jun. 9, 2008 (JP) .................................. 2008-151038

(51) Int. Cl.
*H01L 31/0224* (2006.01)
*H01L 31/0236* (2006.01)
(Continued)

(52) U.S. Cl.
CPC .. *H01L 31/03921* (2013.01); *H01L 31/02366* (2013.01); *H01L 31/03685* (2013.01);
(Continued)

(58) Field of Classification Search
None
See application file for complete search history.

(56) References Cited

U.S. PATENT DOCUMENTS 4,116,718 A * 9/1978 Yerkes ................ H01L 31/0547
136/246
4,224,084 A * 9/1980 Pankove ............. H01L 21/3221
136/258
(Continued)

FOREIGN PATENT DOCUMENTS

JP          63 258077       10/1988
JP          64 61963        3/1989
(Continued)

OTHER PUBLICATIONS

U.S. Appl. No. 13/256,813, filed Sep. 15, 2011, Tokioka, et al.
(Continued)

*Primary Examiner* — Magali P Slawski
(74) *Attorney, Agent, or Firm* — Oblon, McClelland, Maier & Neustadt, L.L.P.

(57) ABSTRACT

A thin-film photoelectric converter in which a first electrode layer formed of a transparent conductive material, a photoelectric conversion layer for photoelectric conversion, and a second electrode layer formed of a conductive material that reflects light are stacked in that order on an insulating light-transmitting substrate. The photoelectric conversion layer and the second electrode layer are divided by dividing grooves into islands that form a plurality of photoelectric conversion cells separated from each other, adjacent ones of the plurality of photoelectric conversion cells separated by the dividing grooves being electrically connected in series. The photoelectric conversion layer includes: a first semiconductor layer including a microcrystalline structure; and a second semiconductor layer including an amorphous structure, the second semiconductor layer being disposed so as to surround all side wall portions of the first semiconductor layer that extend in in-plane directions of the insulating light-transmitting substrate.

8 Claims, 16 Drawing Sheets

(51) Int. Cl.
*H01L 31/0475* (2014.01)
*H01L 31/046* (2014.01)
*H01L 31/0392* (2006.01)
*H01L 31/0368* (2006.01)
*H01L 31/18* (2006.01)

(52) U.S. Cl.
CPC ........ *H01L 31/046* (2014.12); *H01L 31/1804* (2013.01); *H01L 31/1824* (2013.01); *Y02E 10/545* (2013.01); *Y02E 10/547* (2013.01); *Y02E 10/548* (2013.01); *Y02P 70/521* (2015.11)

(56) References Cited

U.S. PATENT DOCUMENTS

| | | | |
|---|---|---|---|
| 4,862,227 A | | 8/1989 | Tsuge et al. |
| 5,348,589 A | * | 9/1994 | Arai et al. .................. 136/244 |
| 6,870,088 B2 | * | 3/2005 | Tachibana et al. ........... 136/249 |
| 7,122,398 B1 | * | 10/2006 | Pichler ............................ 438/66 |
| 2002/0185170 A1 | * | 12/2002 | Shiotsuka et al. ............ 136/251 |
| 2004/0112426 A1 | * | 6/2004 | Hagino ......................... 136/261 |
| 2005/0016583 A1 | * | 1/2005 | Blieske et al. ............... 136/256 |
| 2005/0039788 A1 | * | 2/2005 | Blieske ................... F24J 2/062 |
| | | | 136/246 |
| 2006/0196536 A1 | * | 9/2006 | Fujioka ............... H01L 31/0468 |
| | | | 136/244 |
| 2007/0065962 A1 | | 3/2007 | Pichler |
| 2009/0014070 A1 | * | 1/2009 | Blyth ...................... H01L 27/30 |
| | | | 136/263 |
| 2009/0126791 A1 | * | 5/2009 | Lu ..................... B32B 17/10036 |
| | | | 136/258 |
| 2009/0165851 A1 | * | 7/2009 | Sekimoto et al. ............ 136/256 |
| 2009/0165855 A1 | * | 7/2009 | Sun et al. ..................... 136/261 |
| 2009/0223562 A1 | * | 9/2009 | Niira et al. ................... 136/256 |
| 2010/0087026 A1 | * | 4/2010 | Winkeler ............... H01L 31/046 |
| | | | 438/61 |
| 2010/0206370 A1 | * | 8/2010 | Toms et al. ................... 136/256 |
| 2010/0294352 A1 | * | 11/2010 | Srinivasan et al. ........... 136/256 |

FOREIGN PATENT DOCUMENTS

| | | |
|---|---|---|
| JP | 9-500236 | 1/1997 |
| JP | 2000 252221 | 9/2000 |
| JP | 2001 94133 | 4/2001 |
| JP | 2005 101422 | 4/2005 |
| WO | 95 03628 | 2/1995 |

OTHER PUBLICATIONS

International Search Report issued Aug. 4, 2009 in PCT/JP09/060169 filed Jun. 3, 2009.
U.S. Appl. No. 13/129,612, filed May 17, 2011, Tokioka, et al.
Decision of a Patent Grant issued Dec. 4, 2012 in Japanese Application No. 2010-516821 (With English Translation).
U.S. Appl. No. 13/002,403, filed Jan. 3, 2011, Yamarin, et al.

* cited by examiner

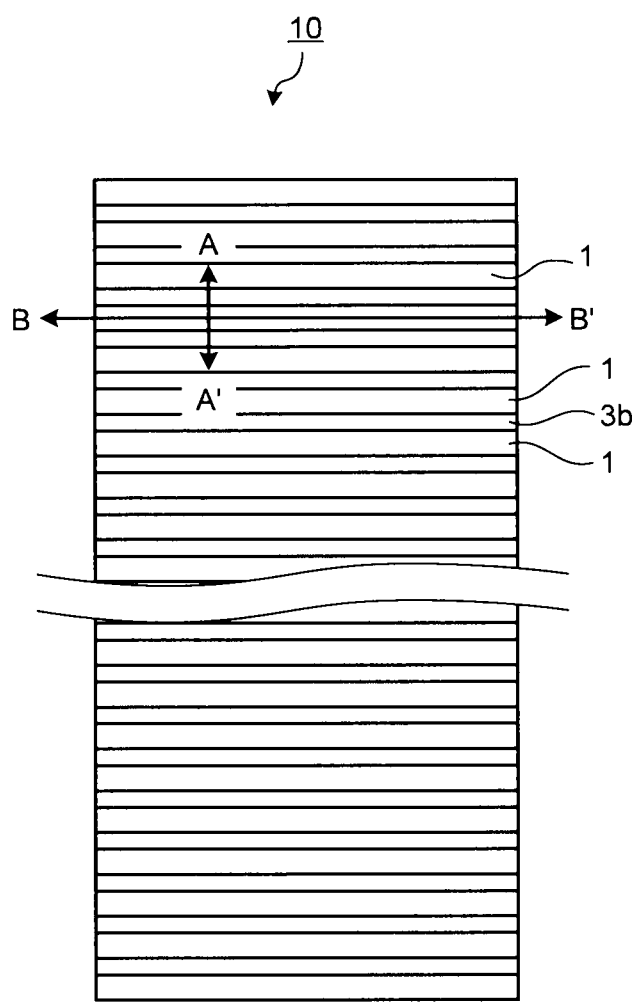

THIN-FILM PHOTOELECTRIC CONVERTER

TECHNICAL FIELD

The present invention relates to a thin-film photoelectric converter and to a method for manufacturing the same.

BACKGROUND ART

In a conventional thin-film solar battery (thin-film photoelectric converter), thin-film solar battery cells (thin-film photoelectric conversion cells) are configured, for example, by forming a thin-film semiconductor layer serving as a photoelectric conversion layer on a substrate having a light-transmitting electrode formed thereon and forming a reflecting conductive film on a rear side. These solar battery cells generate photo-electromotive force when light is incident from the front side (light-transmitting electrode side).

The thin-film solar battery is configured such that adjacent ones of a plurality of thin-film solar battery cells are spaced apart by a predetermined distance, and the thin-film solar battery cells are electrically connected in series. The photoelectric conversion layers between adjacent thin-film solar battery cells are electrically isolated from each other.

Such a thin-film solar battery is manufactured by the following method. First, an insulating light-transmitting substrate which has a transparent electrode layer made of a transparent conductive oxide (TCO) such as tin oxide ($SnO_2$) or zinc oxide (ZnO) formed thereon is prepared, and the transparent electrode layer has an irregular texture structure formed on its surface. The transparent electrode layer is cut and removed by irradiation with a laser beam so as to be processed into a stripe shape. The texture structure has a function of scattering sunlight incident on the solar battery to improve the efficiency of light utilization in the thin-film semiconductor layer. Next, a photoelectric conversion thin-film semiconductor layer made, for example, of amorphous silicon is formed on the transparent electrode layer by, for example, plasma CVD (Chemical Vapor Deposition).

Subsequently the thin-film semiconductor layer is cut and removed by applying a laser beam to positions different from the positions at which the transparent electrode layer has been cut so as to be processed into a stripe shape. Next, a rear-side electrode layer made of a light-reflecting metal is formed on the photoelectric conversion thin-film semiconductor layer by, for example, sputtering, and then the rear-side electrode layer is cut and removed by applying a laser beam to the positions different from the positions at which the transparent electrode layer has been cut so as to be processed into a stripe shape. In such a thin-film solar battery module, the photoelectric conversion cells processed into a stripe shape are connected in series to generate a high output voltage.

In such a thin-film solar battery, the quality of the thin-film semiconductor layer serving as the photoelectric conversion layer largely controls the power generation efficiency of the battery. For example, when the thin-film semiconductor layer is a silicon film, the density of structural defects present in the silicon film must be about $1\times10^{15}/cm^3$ to achieve sufficient power generation efficiency. Impurities present in the silicon film also reduce the power generation efficiency. In particular, when the thin-film semiconductor layer is a microcrystalline silicon film, the oxidation of the microcrystalline silicon film due to the ingress of oxygen into the silicon film significantly reduces the power generation efficiency.

In one method proposed to solve these problems, a microcrystalline silicon film in which the crystalline orientation in a direction perpendicular to the surface of a substrate is controlled is formed by, for example, plasma CDV to suppress oxidation of the silicon film (see, for example, Patent Document 1). More specifically, it has been found that the ingress of impurities is suppressed when the crystalline orientation is controlled such that the crystals are mainly oriented in (220). However, when the crystals are mainly oriented in (111), the ingress of impurities is facilitated, and the power generation efficiency is thereby reduced. Moreover, by increasing the degree of vacuum in a deposition chamber when the microcrystalline silicon film is deposited by plasma CVD, the ingress of impurities into the microcrystalline silicon film during deposition is suppressed.

PRIOR ART DOCUMENTS

Patent Documents

Patent Document 1: Japanese Patent Application Laid-open No. 2000-252221
Patent Document 2: Japanese Patent Application Laid-open No. 2001-094133
Patent Document 3: Japanese Patent Application Laid-open No. 2005-101422

DISCLOSURE OF INVENTION

Problem to be Solved by the Invention

With the conventional technology described above, however, even when the crystals are oriented in (220) immediately after deposition, impurities such as oxygen gradually enter the microcrystalline silicon film during long-term use of the solar battery. In particular, the side walls of the thin-film semiconductor layer that has been processed by irradiation with a laser beam during formation of the thin-film solar battery (thin-film photoelectric converter) are exposed directly to the air, a molding resin, or the like. Therefore, the ingress of impurities or water from the resin cannot be prevented. Since the area of the side walls of the thin-film semiconductor layer is small, the influence of the impurities or water on the power generation characteristics is small in the initial stage of use. However, the amount of impurities that enter the thin-film semiconductor layer increases during long-term use, and this causes a problem of deterioration of the power generation characteristics.

For the purpose of reducing leakage current in the semiconductor layer, several configurations have been proposed, for example, including those in which amorphous silicon regions are formed around openings for separating adjacent unit solar cells, and those in which a silicon film is deposited on the surface of an insulating layer with large irregularities to form regions having a lower degree of crystallinity than the portions therearound in a direction parallel to the substrate surface of a photoelectric conversion layer (see, for example, Patent Document 2 and Patent Document 3). However, with these structures, it is difficult to eliminate the deterioration of the power generation characteristics due to the ingress of impurities into the thin-film semiconductor layer.

The present invention has been made in view of the above problems, and it is an object of the invention to provide a thin-film photoelectric converter including a microcrystalline film serving as a photoelectric conversion layer. In the thin-film photoelectric converter obtained, a reduction in photoelectric conversion efficiency due to the ingress of impurities into the photoelectric conversion layer is prevented, and deterioration in long-term use is prevented to ensure high reliability.

Means for Solving Problem

In order to solve the above problems and achieve the object, a thin-film photoelectric converter in which a first electrode layer formed of a transparent conductive material, a photoelectric conversion layer for photoelectric conversion, and a second electrode layer formed of a conductive material that reflects light are stacked in that order on an insulating light-transmitting substrate. The photoelectric conversion layer and the second electrode layer being divided by dividing grooves into islands that form a plurality of photoelectric conversion cells separated from each other, adjacent ones of the plurality of photoelectric conversion cells separated by the dividing grooves being electrically connected in series. The photoelectric conversion layer includes: a first semiconductor layer including a microcrystalline structure; and a second semiconductor layer including an amorphous structure, the second semiconductor layer is disposed so as to surround all side wall portions of the first semiconductor layer that extend in in-plane directions of the insulating light-transmitting substrate.

Effect of the Invention

In the thin-film photoelectric converter utilizing a microcrystalline film serving as a photoelectric conversion layer according to the present invention, all the side wall portions of the photoelectric conversion layer are surrounded by amorphous films which are less to be oxidized than the microcrystalline film and in which the diffusivity of impurities such as oxygen is low. This can prevent the ingress of impurities such as oxygen into the photoelectric conversion layer due to oxidation. Therefore, a reduction in the photoelectric conversion efficiency due to the ingress of impurities into the photoelectric conversion layer is prevented, and deterioration in long-term use is thereby prevented. This provides an advantageous effect in that the long-term reliability of the thin-film photoelectric converter can be improved.

BRIEF DESCRIPTION OF DRAWINGS

FIG. 1 is a plan view illustrating the schematic structure of a thin-film photoelectric conversion module according to a first embodiment of the present invention.

FIG. 4-1 is a cross-sectional view illustrating an example of a method for manufacturing the thin-film photoelectric conversion module according to the first embodiment of the present invention.

FIG. 4-2 is a cross-sectional view illustrating the example of the method for manufacturing the thin-film photoelectric conversion module according to the first embodiment of the present invention.

FIG. 4-3 is a cross-sectional view illustrating the example of the method for manufacturing the thin-film photoelectric conversion module according to the first embodiment of the present invention.

FIG. 4-4 is a cross-sectional view illustrating the example of the method for manufacturing the thin-film photoelectric conversion module according to the first embodiment of the present invention.

FIG. 4-5 is a cross-sectional view illustrating the example of the method for manufacturing the thin-film photoelectric conversion module according to the first embodiment of the present invention.

FIG. 4-6 is a cross-sectional view illustrating the example of the method for manufacturing the thin-film photoelectric conversion module according to the first embodiment of the present invention.

FIG. 4-7 is a cross-sectional view illustrating the example of the method for manufacturing the thin-film photoelectric conversion module according to the first embodiment of the present invention.

FIG. 4-8 is a cross-sectional view illustrating the example of the method for manufacturing the thin-film photoelectric conversion module according to the first embodiment of the present invention.

FIG. 4-9 is a cross-sectional view illustrating the example of the method for manufacturing the thin-film photoelectric conversion module according to the first embodiment of the present invention.

FIG. 4-10 is a cross-sectional view illustrating the example of the method for manufacturing the thin-film photoelectric conversion module according to the first embodiment of the present invention.

FIG. 5-1 is a cross-sectional view illustrating the example of the method for manufacturing the thin-film photoelectric conversion module according to the first embodiment of the present invention.

FIG. 5-2 is a cross-sectional view illustrating the example of the method for manufacturing the thin-film photoelectric conversion module according to the first embodiment of the present invention.

FIG. 5-3 is a cross-sectional view illustrating the example of the method for manufacturing the thin-film photoelectric conversion module according to the first embodiment of the present invention.

FIG. 6 is a plan view illustrating the schematic structure of a thin-film photoelectric conversion module according to a second embodiment of the present invention.

FIG. 7 is a cross-sectional view of a principal part taken along line segment C-C' in FIG. 6, illustrating the cross-sectional structure of the thin-film photoelectric conversion module according to the second embodiment of the present invention.

FIG. 8 is a cross-sectional view taken along line segment D-D' in FIG. 6, illustrating the longitudinal cross-sectional structure of a unit photoelectric conversion cell constituting the thin-film photoelectric conversion module according to the second embodiment of the present invention.

FIG. 9-1 is a cross-sectional view illustrating one example of a method for manufacturing the thin-film photoelectric conversion module according to the second embodiment of the present invention.

FIG. 9-2 is a cross-sectional view illustrating the example of the method for manufacturing the thin-film photoelectric conversion module according to the second embodiment of the present invention.

FIG. 9-3 is a cross-sectional view illustrating the example of the method for manufacturing the thin-film photoelectric conversion module according to the second embodiment of the present invention.

FIG. 9-4 is a cross-sectional view illustrating the example of the method for manufacturing the thin-film photoelectric conversion module according to the second embodiment of the present invention.

FIG. 9-5 is a cross-sectional view illustrating the example of the method for manufacturing the thin-film photoelectric conversion module according to the second embodiment of the present invention.

FIG. 10 is a cross-sectional view illustrating the example of the method for manufacturing the thin-film photoelectric conversion module according to the second embodiment of the present invention.

FIG. 15-1 is a cross-sectional view illustrating one example of a method for manufacturing the thin-film photoelectric conversion module according to the third embodiment of the present invention.

FIG. 15-2 is a cross-sectional view illustrating the example of the method for manufacturing the thin-film photoelectric conversion module according to the third embodiment of the present invention.

FIG. 15-3 is a cross-sectional view illustrating the example of the method for manufacturing the thin-film photoelectric conversion module according to the third embodiment of the present invention.

BEST MODES FOR CARRYING OUT THE INVENTION

Hereinafter, embodiments of a thin-film photoelectric converter and a method for manufacturing the same according to the present invention will be described in detail with reference to the drawings. The present invention is not limited to the following description, and appropriate modifications may be made within the scope of the present invention. In the following drawings, the scales of the components may be different from the actual scales for ease of understanding. The scales of the respective drawings may also be different from each other.

First Embodiment

Figure 2:
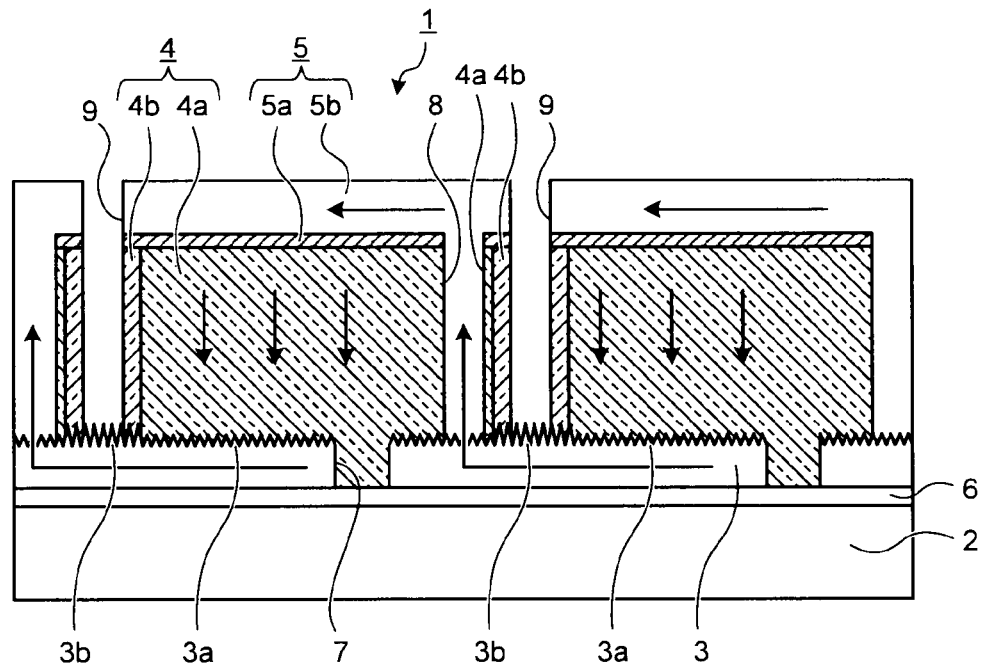
FIG. 2 is a cross-sectional view of a principal part taken along line segment A-A' in FIG. 1, illustrating the cross-sectional structure of the thin-film photoelectric conversion module according to the first embodiment of the present invention.
Figure 3:
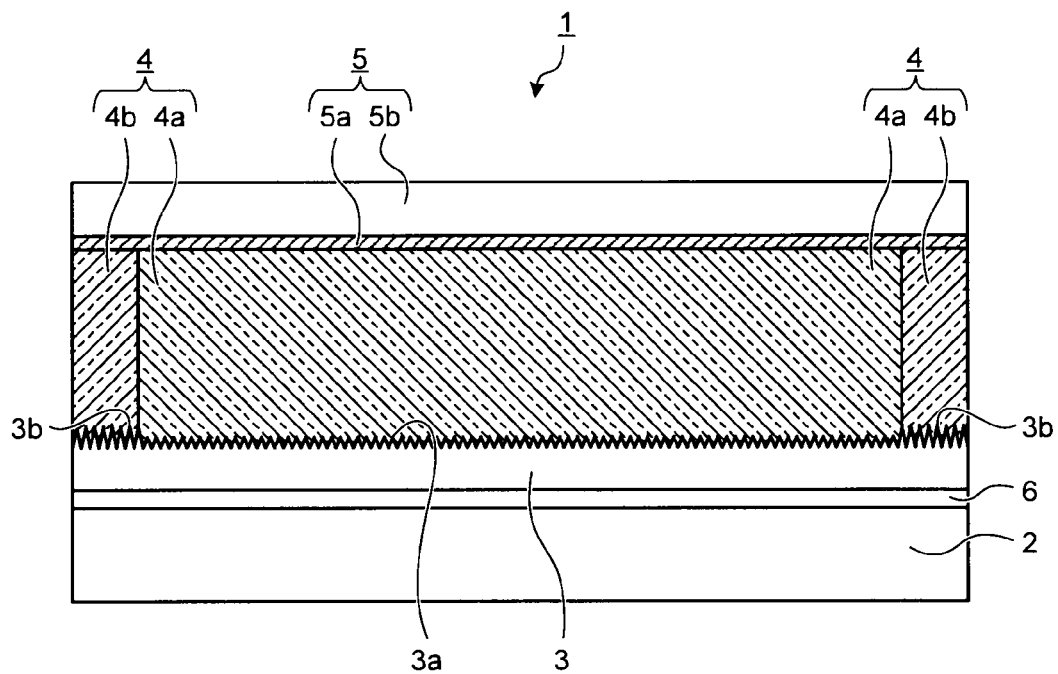
FIG. 3 is a cross-sectional view taken along line segment B-B' in FIG. 1, illustrating the longitudinal cross-sectional structure of a unit photoelectric conversion cell constituting the thin-film photoelectric conversion module according to the first embodiment of the present invention.
Figures 1, 4:
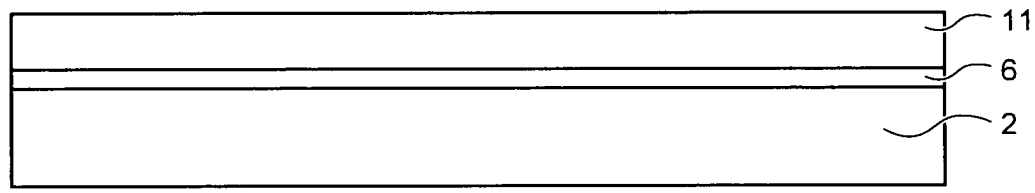
Figures 2, 4:
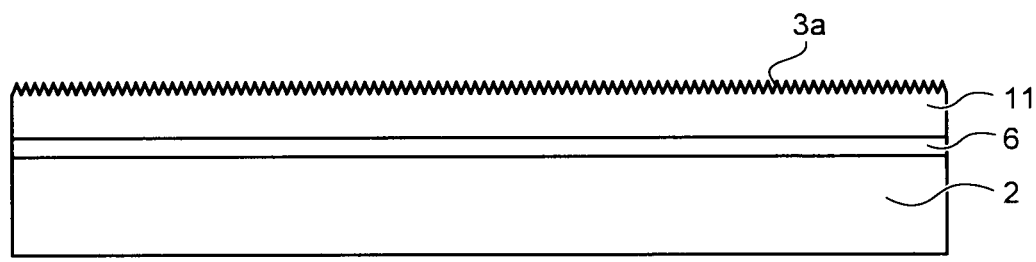
Figures 3, 4:
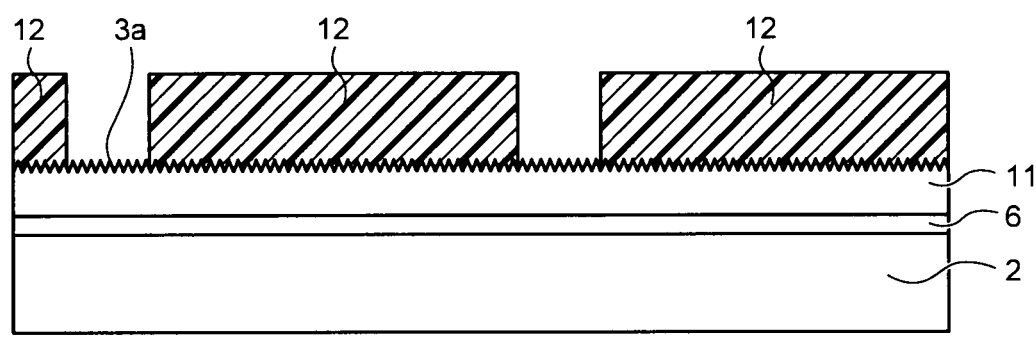
Figure 4:
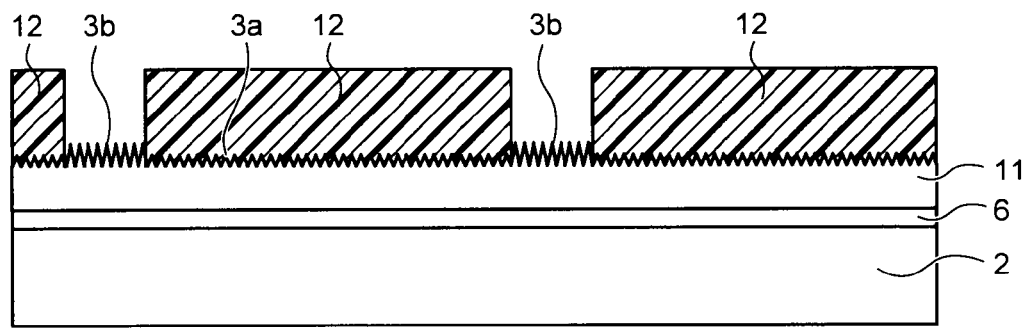

FIG. 1 is a plan view illustrating the schematic structure of a thin-film photoelectric conversion module (hereinafter referred to as a module) 10, which is a thin-film photoelectric converter according to a first embodiment of the present invention. FIG. 2 is a cross-sectional view of a principal part taken along line segment A-A' in FIG. 1, illustrating the cross-sectional structure of the module 10. FIG. 3 is a cross-sectional view taken along line segment B-B' in FIG. 1, illustrating the longitudinal cross-sectional structure of a unit thin-film photoelectric conversion cell (which hereinafter may be referred to as a unit cell) 1 constituting the module 10.

As illustrated in FIGS. 1 to 3, the module 10 according to the first embodiment includes a plurality of strip-shaped (rectangular) unit cells 1 and has a structure in which these unit cells 1 are connected in series. Each of the unit cells 1 has a structure in which a transparent electrode layer 3 serving as a first electrode, a photoelectric conversion layer 4, and a rear-side electrode layer 5 serving as a second electrode are stacked in that order on an insulating light-transmitting substrate 2. As illustrated in FIG. 2, an undercoat layer 6 formed of silicon oxide (hereinafter simply referred to as $SiO_2$) and serving as a layer for blocking impurities is disposed on the insulating light-transmitting substrate 2, if necessary.

Stripe-shaped first grooves 7 are formed in the transparent electrode layer 3 formed on the insulating light-transmitting substrate 2. These first grooves 7 extend substantially parallel to the short-side direction of the insulating light-transmitting substrate 2 and reach the insulating light-transmitting substrate 2. The photoelectric conversion layer 4 is embedded in the first grooves 7, and the transparent electrode layer 3 formed is thereby separated for each cell so as to extend between adjacent cells. Stripe-shaped second grooves 8 are formed in the photoelectric conversion layer 4 formed on the transparent electrode layer 3. These second grooves 8 are formed at locations different from the locations of the first grooves 7, extend substantially parallel to the short-side direction of the insulating light-transmitting substrate 2, and reach the transparent electrode layer 3. The rear-side electrode layer 5 is embedded in the second grooves 8 and is thereby connected to the transparent electrode layer 3. Since the transparent electrode layer 3 extends between adjacent cells, the rear-side electrode layer 5 and the transparent electrode layer 3 on an adjacent cell are electrically connected.

Stripe-shaped third grooves 9 are formed through the rear-side electrode layer 5 and the photoelectric conversion layer 4. These third grooves 9 are formed at locations different from the locations of the first grooves 7 and the second grooves 8 and reach the transparent electrode layer 3, and the unit cells 1 are thereby separated from each other. Since the transparent electrode layer 3 in a unit cell 1 is connected to the rear-side electrode layer 5 in an adjacent unit cell 1, as described above, unit cells 1 adjacent to each other are electrically connected in series.

The transparent electrode layer 3 is constituted by a transparent conductive oxide film such as a zinc oxide (ZnO), indium tin oxide (ITO), or tin oxide ($SnO_2$) film or a light-transmitting film such as a film prepared by adding aluminum (Al) to the above transparent conductive oxide film. The transparent electrode layer 3 has a surface texture structure in which surface irregularities are formed. The texture structure has a function of scattering incident sunlight to improve the light utilization efficiency in the photoelectric conversion layer 4. The transparent electrode layer 3 has regions with different degrees of irregularities (surface roughness) that include regions having large irregularities 3b formed thereon (regions with large surface roughness) and other regions, i.e., regions having small irregularities 3a formed thereon (regions with small surface roughness). The regions having the large irregularities 3b formed thereon (the regions with large surface roughness) are disposed under the side walls of the unit cells 1 and around the side walls, as illustrated in FIG. 2.

As illustrated in FIG. 3, in the transparent electrode layer 3, portions around substrate edges in the short-side direction of the unit cells 1, i.e., regions around the side walls in the short-side direction of the unit cells 1, are also regions having large irregularities 3b formed thereon (regions with large surface roughness). The surface roughness of these regions is greater than that of the inner regions of the unit cells 1 that extend in in-plane directions of the insulating light-transmitting substrate 2.

The photoelectric conversion layer 4 is formed by stacking at least one thin-film semiconductor layer that has a PN junction or PIN junction to generate electric power when light is incident thereon. The photoelectric conversion layer 4 is patterned to expose the regions of the transparent electrode layer 3 that have the large irregularities 3b formed thereon (the regions with large surface roughness), and unit cells 1 adjacent to each other are thereby separated. In the photoelectric conversion layer 4, regions above the regions of the transparent electrode layer 3 that have the large irregularities 3b formed thereon (the regions with large surface roughness) are formed a noncrystalline structure layer 4b constituted with a noncrystalline (hereinafter may be referred to as amorphous) film that resists the ingress of impurities. Other regions of the photoelectric conversion layer 4, i.e., regions above the regions of the transparent electrode layer 3 that have the small irregularities 3a formed thereon (the regions with small surface roughness) are formed as a microcrystalline structure layer 4a formed of a microcrystalline film. Therefore, the side wall portions of the photoelectric conversion layer 4 are the amorphous structure layer 4b constituted with the amorphous film.

In addition, as illustrated in FIG. 3, in the photoelectric conversion layer 4, portions located at the substrate edges in the short-side direction of the unit cells 1, i.e., side wall portions opposed in the longitudinal direction of the unit cells 1, are formed as the amorphous structure layer 4b constituted with the amorphous material. The amorphous film is less likely to be oxidized than the microcrystalline film, and the diffusivity of impurities such as oxygen in the amorphous film is low. Therefore, in each unit cell 1, the entire side wall portions (outer circumferential portions) of the photoelectric conversion layer 4 are formed as the amorphous structure layer 4b, and the entire outer circumferential portions of the microcrystalline structure layer 4a are surrounded by the amorphous structure layer 4b. With this structure, impurities such as oxygen are less likely to enter the microcrystalline structure layer 4a from the outside.

Microcrystalline silicon, microcrystalline silicon-germanium, microcrystalline silicon carbide, or the like may be used for the microcrystalline structure layer 4a. Hydrogenated amorphous silicon, amorphous silicon-germanium, amorphous silicon carbide, or the like may be used for the amorphous structure layer 4b.

The photoelectric conversion layer 4 includes, for example, a p-type hydrogenated microcrystalline silicon (μc-Si:H) layer, an i-type hydrogenated microcrystalline silicon (μc-Si:H) layer, and an n-type hydrogenated microcrystalline silicon (μc-Si:H) layer to form a PIN junction. In this case, the influence of the surface irregularities of the transparent electrode layer 3 reaches the n-type hydrogenated microcrystalline silicon (μc-Si:H) layer on the upper side, as described later. Therefore, in each of the p-, i-, and n-type hydrogenated microcrystalline silicon (μc-Si:H) layers, regions that lie above the regions of the transparent electrode layer 3 that have the large irregularities 3b formed thereon (the regions with large surface roughness) have an amorphous structure.

The photoelectric conversion layer 4 may have a two-PIN junction structure including a p-type hydrogenated amorphous silicon carbide (a-SiC:H) layer, an i-type hydrogenated amorphous silicon (a-Sic:H) layer, an n-type hydrogenated microcrystalline silicon (μc-Si:H) layer, a p-type hydrogenated microcrystalline silicon (μc-Si:H) layer, an i-type hydrogenated microcrystalline silicon (μc-Si:H) layer, and an n-type hydrogenated microcrystalline silicon (μc-Si:H) layer. Instead of the n-type hydrogenated microcrystalline silicon (μc-Si:H), n-type a-Si:H may be used.

Also in the above case, the influence of the surface irregularities of the transparent electrode layer 3 reaches the n-type hydrogenated microcrystalline silicon (μc-Si:H) layer on the upper side, as described later. Therefore, in each of the hydrogenated microcrystalline silicon (μc-Si:H) layers, regions that lie above the regions of the transparent electrode layer 3 that have the large irregularities 3b formed thereon (the regions with large surface roughness) have an amorphous structure.

When the photoelectric conversion layer 4 is formed by stacking a plurality of thin-film semiconductor layers as in the above two-PIN junction structure, an intermediate layer such as a microcrystalline silicon monoxide (μc-SiO) layer or an aluminum-doped zinc oxide layer (ZnO:Al) may be inserted between the PIN junctions to improve the electrical and optical connection between the PIN junctions.

The rear-side electrode layer 5 is patterned at positions different from the patterned positions of the photoelectric conversion layer 4 into a shape different from the shape of the photoelectric conversion layer 4 and includes a transparent conductive metal compound layer 5a and a metal layer 5b, as illustrated in FIG. 2. For example, tin oxide ($SnO_2$), zinc oxide (ZnO), ITO, or a combination thereof may be used for the transparent conductive metal compound layer 5a. Silver (Ag) or aluminum (Al) may be used for the metal layer 5b.

Next, the outline of the operation of the module 10 according to the first embodiment will be explained. When sunlight is incident on the module 10 from the rear surface of the insulating light-transmitting substrate 2 (the surface on which the unit cells 1 are not formed), free carriers are generated in the photoelectric conversion layer 4, and electric current is thereby generated. The electric current generated in each unit cell 1 flows into an adjacent unit cell 1 through the transparent electrode layer 3 and the rear-side electrode layer 5, and the electric current of the module 10 as a whole is thereby generated.

Figures 4, 5:
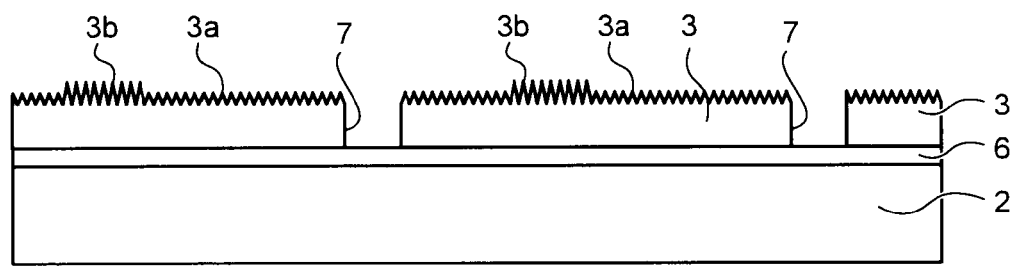

Next, a method for manufacturing the module 10 configured as described above according to the first embodiment will be explained. FIGS. 4-1 to 4-10 are cross-sectional views taken along line segment A-A' in FIG. 1, illustrating an example of the method for manufacturing the module 10. FIGS. 5-1 to 5-3 are cross-sectional views taken along line segment B-B' in FIG. 1, illustrating the example of the method for manufacturing the module 10.

First, the insulating light-transmitting substrate 2 is prepared. Herein, a flat white glass plate is used as the insulating light-transmitting substrate 2. An $SiO_2$ film serving as the undercoat layer 6 is deposited on one side of the insulating light-transmitting substrate 2 by, for example, sputtering. Next, as illustrated in FIG. 4-1, a ZnO film serving as a transparent conductive film 11 that will form the transparent electrode layer 3 is formed on the undercoat layer 6 by sputtering. In addition to the ZnO film, any of transparent conductive oxide films such as ITO and $SnO_2$ films and films prepared by adding a metal such as Al to these transparent conductive oxide films to improve conductivity may be used as the material for the transparent conductive film 11. Any other deposition method such as CVD may be used.

Then the surface of the transparent conductive film 11 is etched with dilute hydrochloric acid to roughen the surface, and small irregularities 3a are thereby formed on the surface of the transparent conductive film 11, as illustrated in FIG. 4-2. However, when the transparent conductive film 11 of, for example, $SnO_2$ or ZnO is formed by CVD, irregularities are formed on the surface of the transparent conductive film 11 in a self-organized manner. Therefore, in this case the formation of irregularities by etching with dilute hydrochloric acid is not necessary.

Next, as illustrated in FIGS. 4-3 and 5-1, the transparent conductive film 11 is covered, except for regions in which the third grooves 9 are later formed to separate elements and regions around the substrate edges in the short-side direction of the unit cells 1, with an etching resist film 12 formed into stripes substantially parallel to the short-side direction of the insulating light-transmitting substrate 2. The etching resist film 12 is formed such that, in the transparent conductive film 11, regions slightly larger than the regions above which the third grooves 9 are later formed (regions from which the transparent conductive film 11 is later removed by irradiation with a laser beam) are not covered so that the transparent conductive film 11 appears. In the present embodiment, an organic resin film is used as the etching resist film 12.

Subsequently the surface regions of the transparent conductive film 11 that are not covered with the etching resist film 12 are again etched with dilute hydrochloric acid to roughen the surface. In the etching of the surface of the transparent conductive film 11 with dilute hydrochloric acid, the longer the etching time is, the larger the surface roughness is. Therefore, the large irregularities 3b are locally formed on the surface regions of the transparent conductive film 11 that have been etched again, and the surface roughness of theses surface regions increases, as illustrated in FIGS. 4-4 and 5-2. Then the etching resist film 12 is removed.

Next, the transparent conductive film 11 is partially cut such that stripe portions substantially parallel to the short-side direction of the insulating light-transmitting substrate 2 are removed. The transparent conductive film 11 is thereby patterned into strips to form a transparent electrode layer 3 including a plurality of separated portions. The transparent conductive film 11 is patterned by laser scribing. More specifically, stripe-shaped first grooves 7 are formed which extend in a direction substantially parallel to the short-side direction of the insulating light-transmitting substrate 2 and reach the insulating light-transmitting substrate 2. In this manner, the stripe-shaped transparent electrode layer 3 having the surface texture structure in which the magnitude of irregularities (surface roughness) varies locally is obtained, as illustrated in FIG. 4-5.

Next, a thin-film semiconductor layer is deposited on the transparent electrode layer 3 by plasma CVD to form a photoelectric conversion layer 4. The thin-film semiconductor layer includes, for example, a p-type hydrogenated microcrystalline silicon (μc-Si:H) layer, an i-type hydrogenated microcrystalline silicon (μc-Si:H) layer, and an n-type hydrogenated microcrystalline silicon (μc-Si:H) layer that are deposited in that order to form the photoelectric conversion layer 4 having a PIN junction.

When the hydrogenated microcrystalline silicon (μc-Si:H) layers are deposited, the influence of the large irregularities 3b formed on the surface of the transparent electrode layer 3 reaches the n-type hydrogenated microcrystalline silicon (μc-Si:H) layer on the upper side. Therefore, in the p-, i-, and n-type hydrogenated microcrystalline silicon (μc-Si:H) layers, microcrystallization does not occur in portions above the large irregularities 3b of the transparent electrode layer 3, i.e., portions above the large-surface roughness regions of the transparent electrode layer 3, and hydrogenated amorphous silicon (a-Si:H) is formed in these portions. This is because, when the surface roughness is large, the film structure is disturbed during film growth and crystal growth is inhibited. However, a crystal layer is grown on the surface regions of the transparent electrode layer 3 that have the small irregularities 3a formed thereon, i.e., the regions with small surface roughness.

Therefore, in the photoelectric conversion layer 4, the amorphous structure layer 4b is formed in regions above the regions of the transparent electrode layer 3 that have the large irregularities 3b formed thereon (the regions with large surface roughness) as illustrated in FIGS. 4-6 and 5-3. The microcrystalline structure layer 4a formed of a microcrystalline film is formed in other regions, i.e., regions above the regions of the transparent electrode layer 3 that have the small irregularities 3a formed thereon (the regions with small surface roughness). Therefore, the amorphous structure layer 4b formed of the amorphous material is formed in regions corresponding to the regions in which the third grooves 9 are formed (regions from which the transparent conductive film 11 is later removed by irradiation with a laser beam) and in portions located at the substrate edges opposed in the short-side direction of the unit cells 1, i.e., side wall portions of the photoelectric conversion layer 4 in the longitudinal direction of the unit cells 1.

Then a transparent conductive metal compound layer 5a formed of tin oxide ($SnO_2$) and serving as the rear-side electrode layer 5 is formed on the photoelectric conversion layer 4 by vacuum deposition, as illustrated in FIG. 4-7. Any other deposition method such as CVD may be used as the method of depositing the transparent conductive metal compound layer 5a.

Next, the transparent conductive metal compound layer 5a and the photoelectric conversion layer 4 are partially cut such that stripe portions substantially parallel to the short-side direction of the insulating light-transmitting substrate 2 are removed. The transparent conductive metal compound layer 5a and the photoelectric conversion layer 4 are thereby patterned into strips separated from each other. The transparent conductive metal compound layer 5a and the photoelectric conversion layer 4 are patterned by laser scribing. More specifically, stripe-shaped second grooves 8 that extend in a direction substantially parallel to the short-side direction of the insulating light-transmitting substrate 2 and reach the transparent electrode layer 3 are formed at positions different from the first grooves 7, as illustrated in FIG. 4-8.

Next, for example, silver (Ag) serving as the metal layer 5b of the rear-side electrode layer 5 is deposited by sputtering on the transparent conductive metal compound layer 5a through which the second grooves 8 have been formed, as illustrated in FIG. 4-9. The metal layer 5b is formed under such conditions that the second grooves 8 are filled with the metal layer 5b. Any other deposition method such as CVD may be used as the method of depositing the metal layer 5b.

Subsequently the metal layer 5b and the photoelectric conversion layer 4 are partially cut such that stripe portions substantially parallel to the short-side direction of the insulating light-transmitting substrate 2 are removed. The metal layer 5b and the photoelectric conversion layer 4 are thereby patterned into strips to form a plurality of separated unit cells 1. The metal layer 5b and the photoelectric conversion layer 4 are patterned by laser scribing so that stripe-shaped third grooves 9 which extend in a direction substantially parallel to the short-side direction of the insulating light-transmitting substrate 2 and reach the transparent electrode layer 3 are formed at positions different from the first grooves 7 and the second grooves 8, i.e., at substantially central portions of the regions of the transparent electrode layer 3 that have the large irregularities 3b formed thereon (the regions with large surface roughness), as illustrated in FIG. 4-10.

Since the third grooves 9 are formed on the regions of the transparent electrode layer 3 that have the large irregularities 3b formed thereon (the regions with large surface roughness), the photoelectric conversion layer 4 is divided at the amorphous structure layer 4b formed on the above regions. Therefore, the side walls of the photoelectric conversion layer 4 that form the surfaces of the third grooves 9 separating the unit cells 1 are formed of the amorphous structure layer 4b. The module 10 is obtained in the manner described above.

As described above, in the thin-film photoelectric converter according to the first embodiment, all the side wall portions of the photoelectric conversion layer 4 are formed of the amorphous film which is less likely to be oxidized than the microcrystalline film and in which the diffusivity of impurities such as oxygen and water is low, and the ingress of oxygen into the photoelectric conversion layer 4 due to oxidation may thereby be prevented. Therefore, in the thin-film photoelectric converter according to the first embodiment in which microcrystalline silicon is used for the photoelectric conversion layer 4, a reduction in the photoelectric conversion efficiency due to the ingress of impurities into the photoelectric conversion layer 4 is prevented, and deterioration in long-term use may thereby be prevented. This provides an advantageous effect in that the long-term reliability of the thin-film photoelectric converter may be improved, which is not achieved in the conventional technology. In addition, the ingress of impurities, water, etc. into the photoelectric conversion layer 4 processed by irradiation with a laser beam during manufacturing may be prevented, and the yield may thereby be improved.

Second Embodiment

Figures 4, 5, 6:
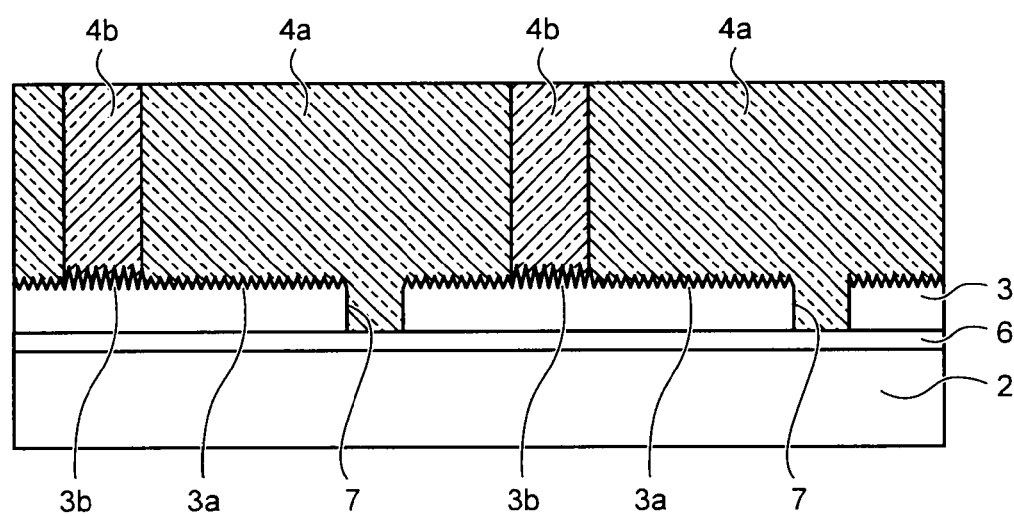
Figures 4, 5, 6, 7:
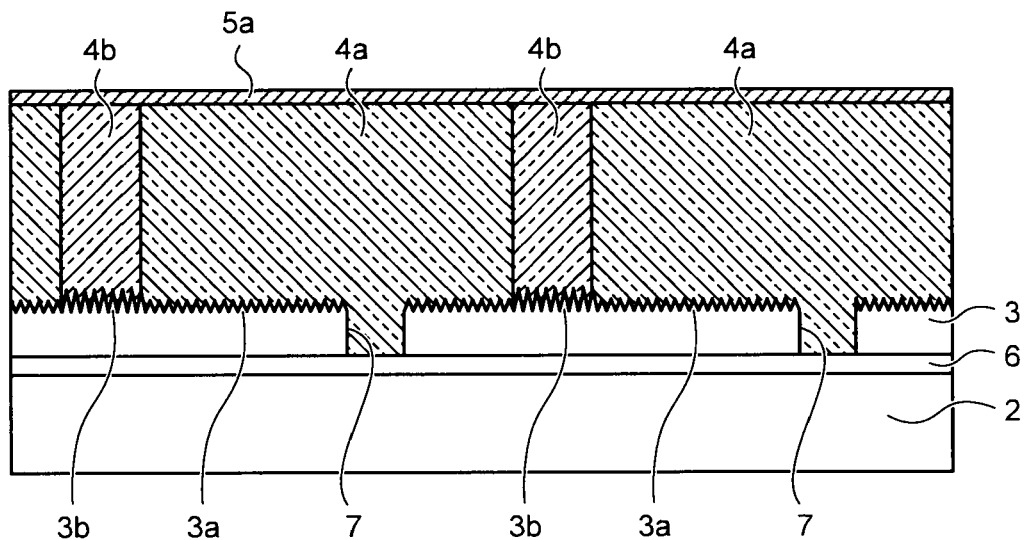
Figures 4, 5, 6, 7, 8:
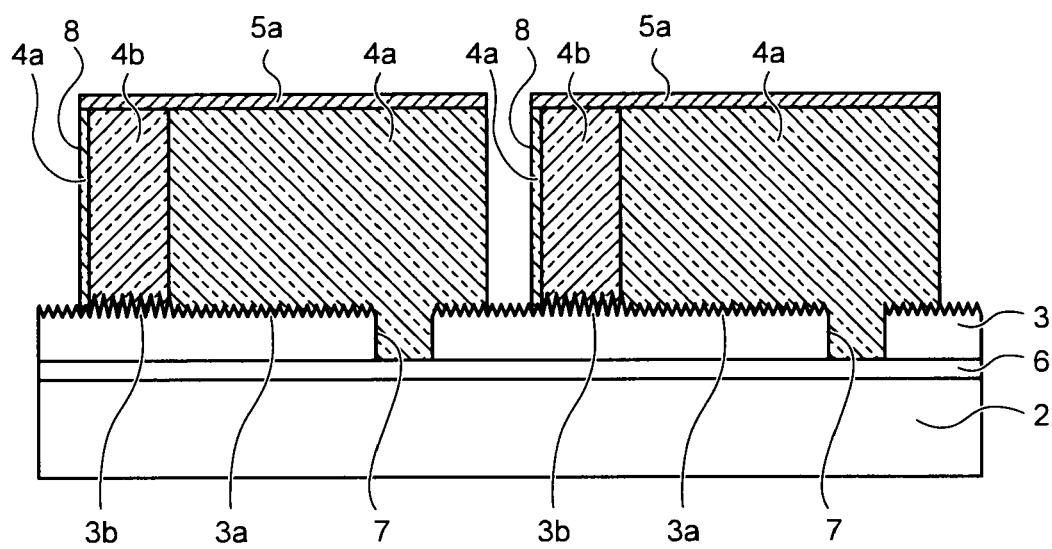

FIG. 6 is a plan view illustrating the schematic structure of a thin-film photoelectric conversion module (hereinafter referred to as a module) 20 of a thin-film photoelectric converter according to a second embodiment of the present invention. FIG. 7 is a cross-sectional view of a principal part taken along line segment C-C' in FIG. 6, illustrating the cross-sectional structure of the module 20. FIG. 8 is a cross-sectional view taken along line segment D-D' in FIG. 6, illustrating the longitudinal cross-sectional structure of a unit cell 21 constituting the module 20. In the following figures, the same components as those in FIGS. 1 to 3 are denoted by the same reference numerals.

As illustrated in FIGS. 6 to 8, the module 20 according to the second embodiment includes a plurality of strip-shaped (rectangular) unit cells 21 and has a structure in which these unit cells 21 are connected in series. The module 20 has the same structure as the module 10 of the first embodiment except that the module 20 includes a metal film 23 of aluminum (Al) which has large irregularities 23b formed thereon (has large surface roughness) and is patterned on the undercoat layer 6 and that the metal film 23 and the transparent electrode layer 3 form the first electrode as a whole. More specifically, each of the unit cells 21 has a structure in which the undercoat layer 6, the transparent electrode layer 3, the photoelectric conversion layer 4, and the rear-side electrode layer 5 are formed in that order on the insulating light-transmitting substrate 2. Therefore, in the following description of the module 20, the metal film 23, which makes difference from the module 10, will be mainly described.

The transparent electrode layer 3 has a surface texture structure in which surface irregularities are formed, as in the module 10. The transparent electrode layer 3 has regions with different degrees of irregularities (surface roughness) that include regions having large irregularities 3b formed thereon (regions with large surface roughness) and other regions, i.e., regions having small irregularities 3a formed thereon (regions with small surface roughness). The regions having the large irregularities 3b formed thereon (the regions with large surface roughness) are disposed below, and around, the side walls of the unit cells 21, which are formed above the metal film 23, as illustrated in FIG. 7.

As illustrated in FIG. 8, in the transparent electrode layer 3, portions around the substrate edge in the short-side direction of the unit cells 21, i.e., regions around the side walls in the short-side direction of the unit cells 21 are also regions having large irregularities 3b formed thereon (regions with large surface roughness). The surface roughness of these regions is greater than that of the inner regions of the unit cells 21 that extend in in-plane directions of the insulating light-transmitting substrate 2.

Figures 4, 5, 6, 7, 8, 9:
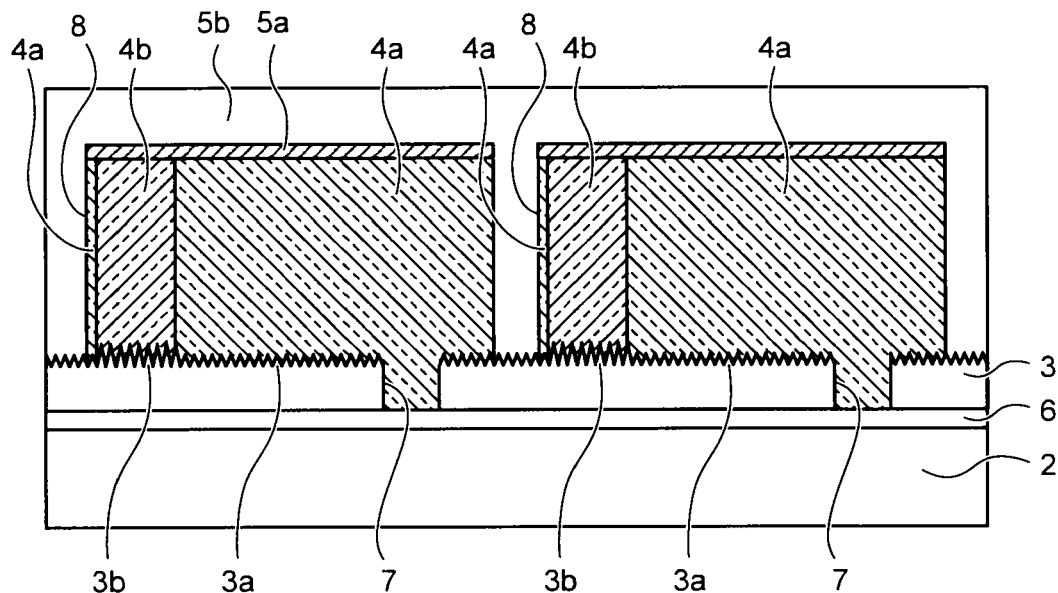
Figures 4, 5, 6, 7, 8, 9, 10:
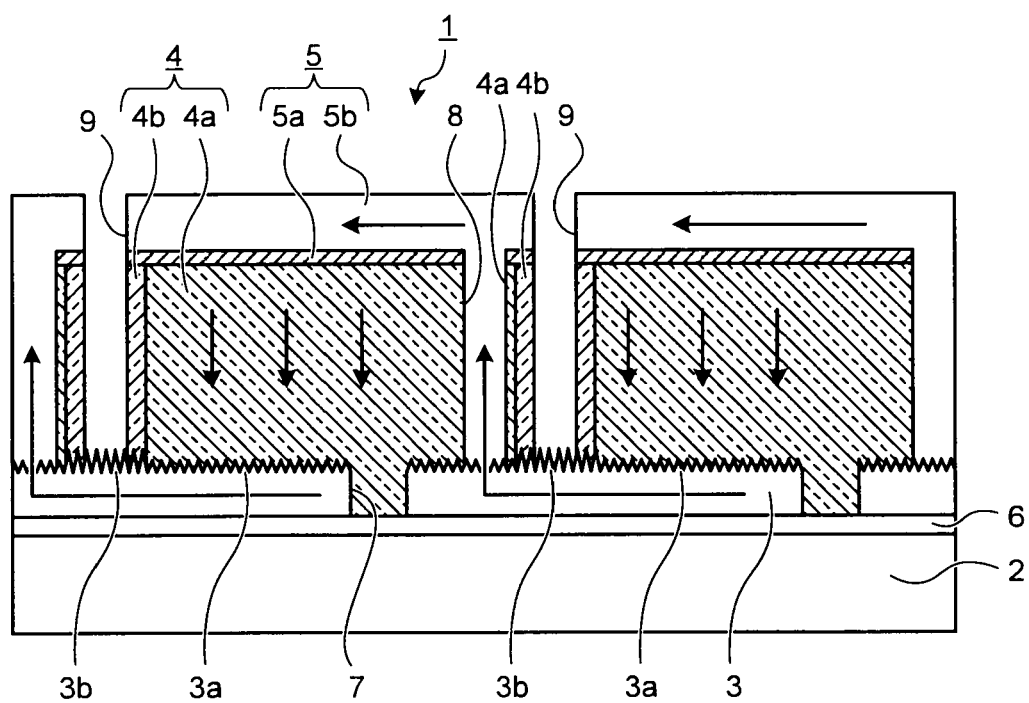
Figures 1, 5:
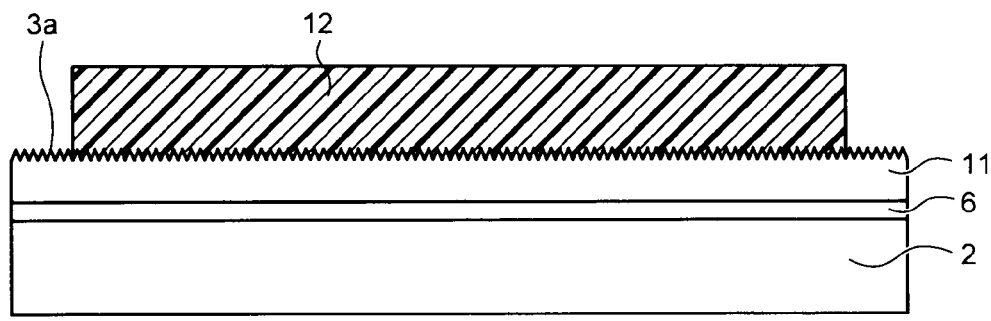
Figures 2, 5:
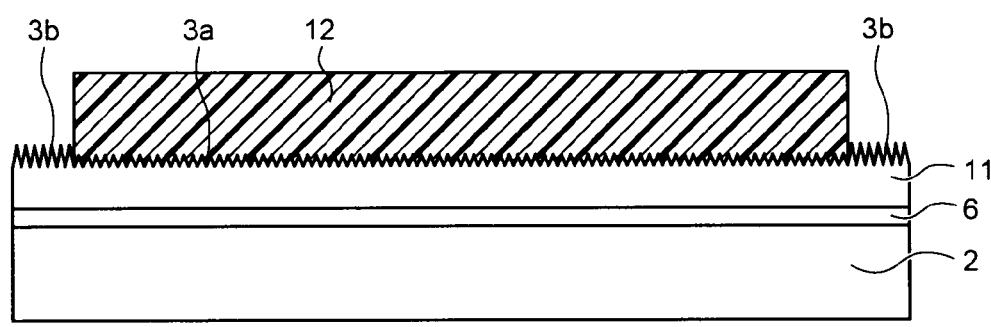
Figures 3, 5:
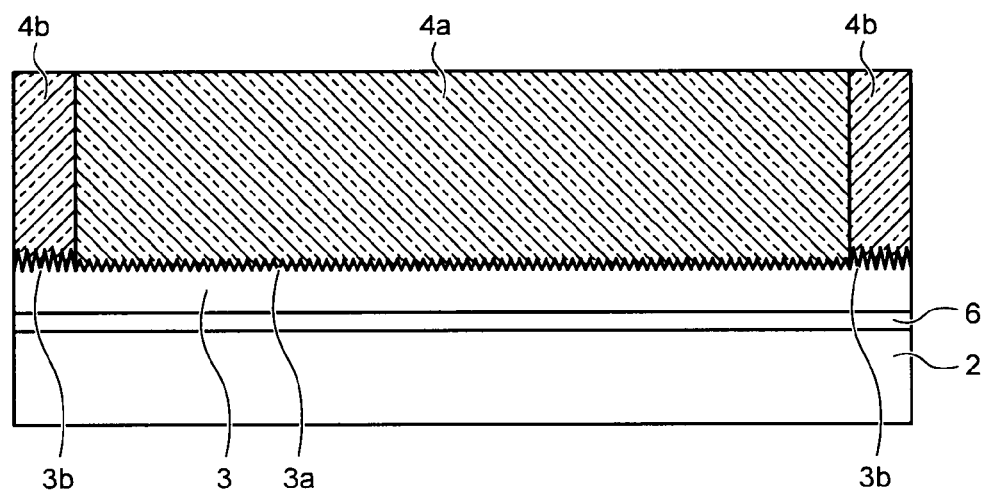
Figure 6:
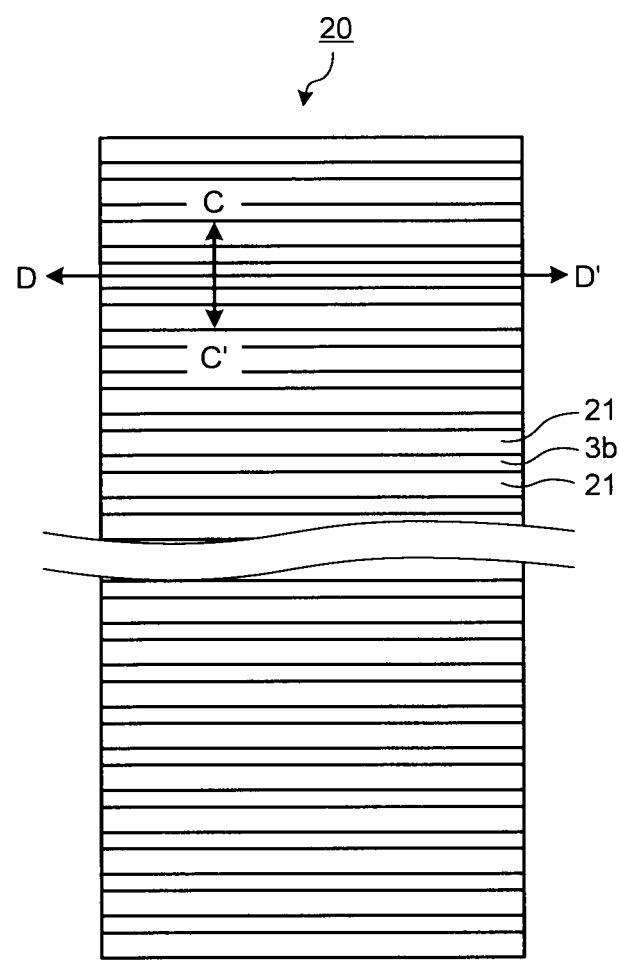
Figure 7:
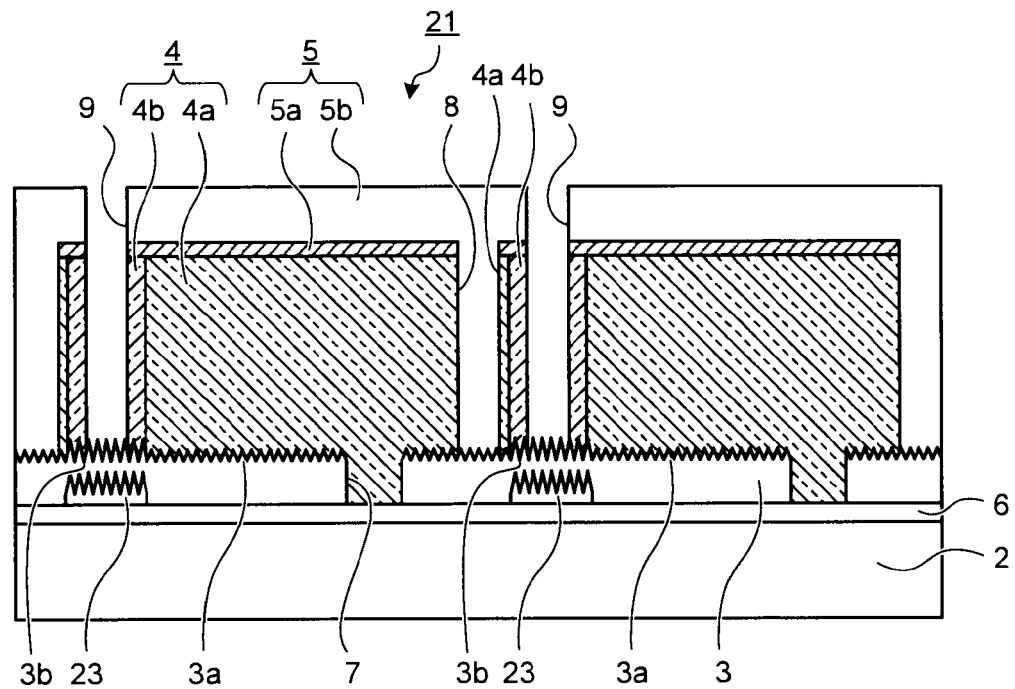
Figure 8:
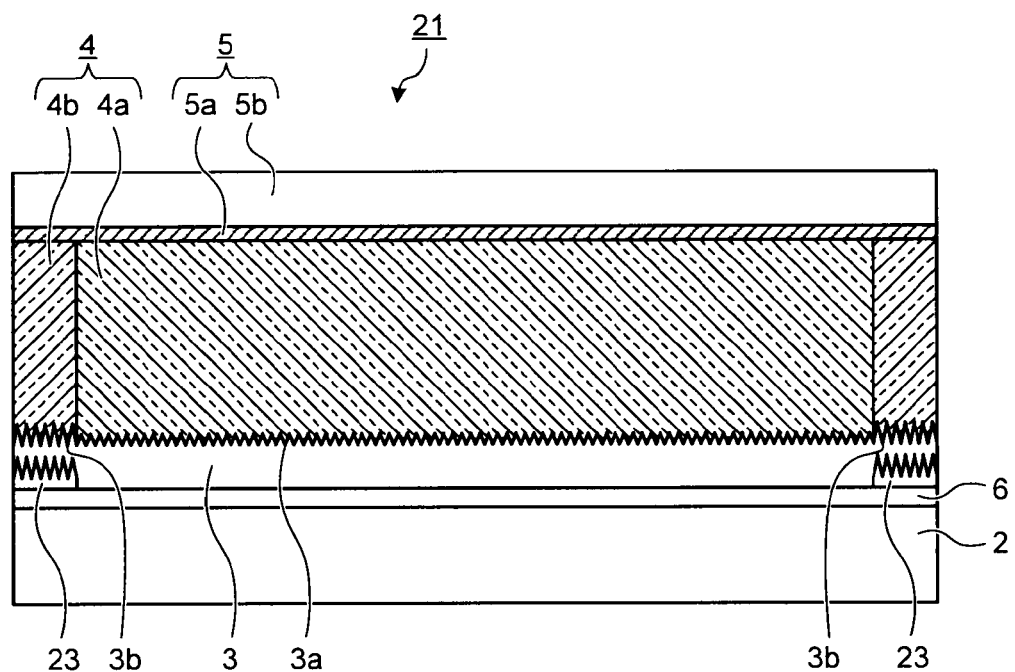
Figures 1, 9:
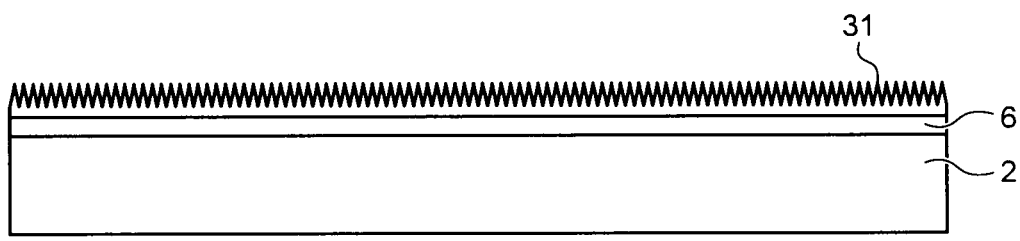
Figures 2, 9:
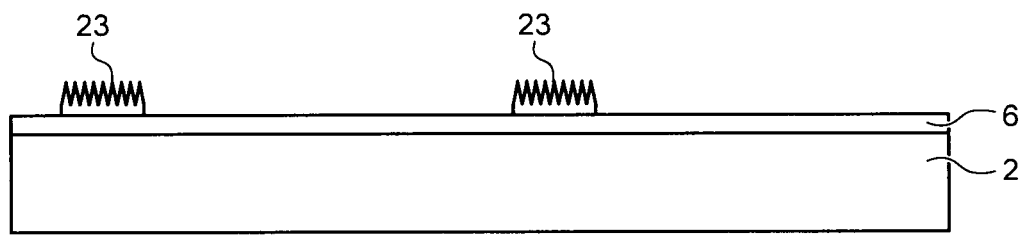
Figures 3, 9:
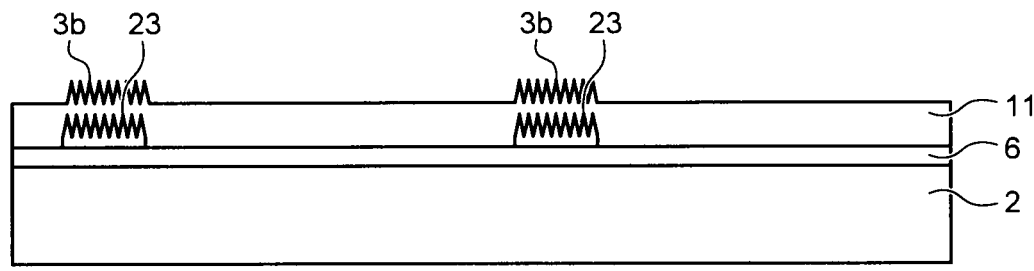
Figures 4, 9:
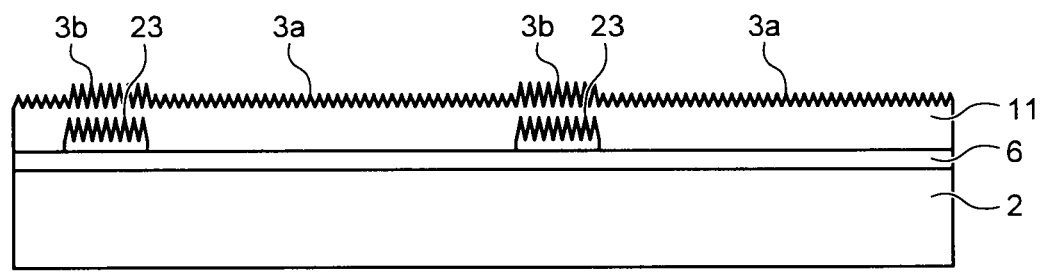
Figures 5, 9:
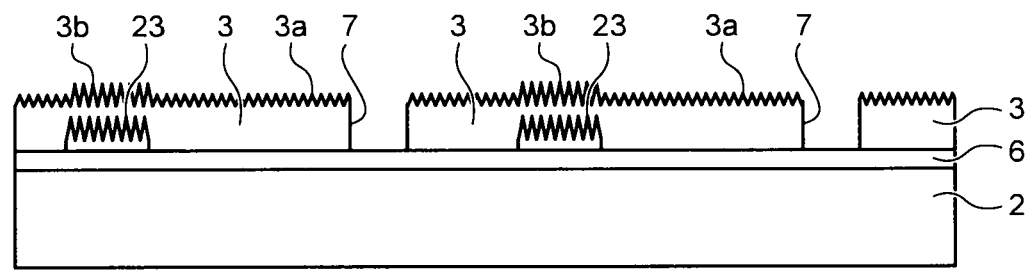
Figure 10:
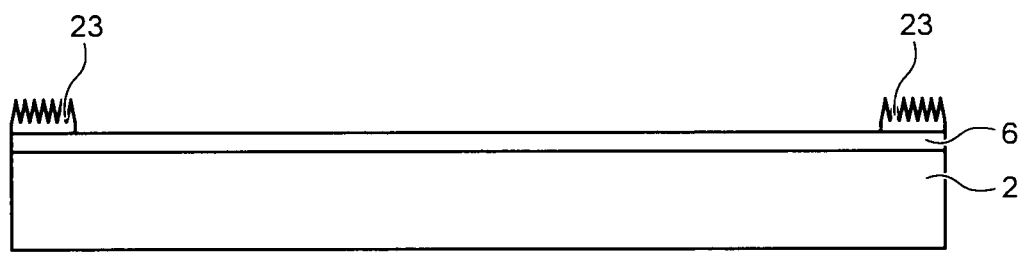
Figure 11:
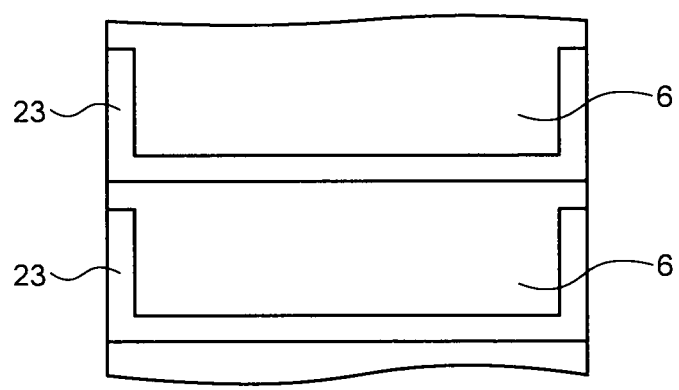
FIG. 11 is a plan view illustrating the example of the method for manufacturing the thin-film photoelectric conversion module according to the second embodiment of the present invention.

Next, a method for manufacturing the module 20 of the thin-film photoelectric converter according to the second embodiment configured as above will be explained. FIGS. 9-1 to 9-5 are cross-sectional views taken along line segment C-C' in FIG. 6, illustrating an example of the method for manufacturing the module 20. FIG. 10 is a cross-sectional view taken along line segment D-D' in FIG. 6, illustrating the example of the method for manufacturing the module 20. FIG. 11 is a plan view when the insulating light-transmitting substrate 2 is viewed from above, illustrating the example of the method for manufacturing the module 20.

First, the insulating light-transmitting substrate 2 is prepared. In this instance, a flat white glass plate is used as the insulating light-transmitting substrate 2. An $SiO_2$ layer serving as the undercoat layer 6 is deposited on one side of the insulating light-transmitting substrate 2 by, for example, sputtering. Next, as illustrated in FIG. 9-1, a metal film 31 is formed on the undercoat layer 6 by, for example, sputtering. During sputtering, hillocks are formed on the surface of the metal film 31 by appropriately adjusting the deposition conditions. The metal film 31 having large irregularities on its surface is thereby obtained.

Next, the metal film 31 is cut and removed by irradiation with a laser beam to form the metal film 23 formed into a substantially square U-frame shape in in-plane directions of the insulating light-transmitting substrate 2, as illustrated in FIGS. 9-2, 10, and 11. More specifically, the metal film 23 formed into a substantially square U-frame shape includes: portions around side wall portions in the short-side direction of the insulating light-transmitting substrate 2; and stripe-shaped regions substantially parallel to the short-side direction of the insulating light-transmitting substrate 2. The open side of the frame-shaped metal film 23 is disposed toward a position at which the transparent electrode layer 3 comes into contact with the rear-side electrode layer 5.

Then, as illustrated in FIG. 9-3, a ZnO film serving as the transparent conductive film 11 that forms the transparent electrode layer 3 is formed by sputtering. The large irregularities on the surface of the metal film 23 formed on the undercoat layer 6 has an influence on regions above the metal film 23. Therefore, in these regions, large irregularities 3b are also formed on the surface of the transparent conductive film 11. In addition to the ZnO film, any of transparent conductive oxide films such as ITO and $SnO_2$ films and films prepared by adding a metal such as Al to these transparent conductive oxide films to improve conductivity may be used as the material for the transparent conductive film 11. Any other deposition method such as CVD may be used.

Subsequently the surface of the transparent conductive film 11 is etched with dilute hydrochloric acid to roughen the surface. During etching of the surface of the transparent conductive film 11 with dilute hydrochloric acid, small irregularities 3a are formed on the flat portions of the transparent conductive film 11 to create surface roughness, as illustrated in FIG. 9-4. In the portions in which the large irregularities 3b have already been formed to create surface roughness, the magnitude of the large irregularities 3b is further increased, and the surface roughness is thereby further increased.

Next, the transparent conductive film 11 is partially cut such that stripe portions substantially parallel to the short-side direction of the insulating light-transmitting substrate 2 are removed. The transparent conductive film 11 is thereby patterned into strips to form a transparent electrode layer 3 including a plurality of separated portions. The transparent conductive film 11 is patterned by laser scribing so that stripe-shaped first grooves 7 are formed which extend in a direction substantially parallel to the short-side direction of the insulating light-transmitting substrate 2 and reach the insulating light-transmitting substrate 2. In this manner, the stripe-shaped transparent electrode layer 3 having the surface texture structure in which the magnitude of irregularities (surface roughness) varies locally is obtained, as illustrated in FIG. 9-5.

Then, the same procedure as in the module 10 is followed to obtain the module 20 illustrated in FIGS. 6 to 8.

As described above, also in the thin-film photoelectric converter according to the second embodiment, all the side wall portions of the photoelectric conversion layer 4 are formed of the amorphous film which is less likely to be oxidized than the microcrystalline film and in which the diffusivity of impurities such as oxygen is low, and the ingress of oxygen into the photoelectric conversion layer 4 due to oxidation may thereby be prevented. Therefore, in the thin-film photoelectric converter according to the second embodiment in which microcrystalline silicon is used for the photoelectric conversion layer 4, a reduction in the photoelectric conversion efficiency due to the ingress of impurities into the photoelectric conversion layer 4 is prevented, and deterioration in long-term use can thereby be prevented. This provides an advantageous effect in that the long-term reliability of the thin-film photoelectric converter can be improved, which is not achieved in the conventional technology. In addition, the ingress of impurities, water, etc. into the photoelectric conversion layer 4 processed by irradiation with a laser beam during manufacturing may be prevented, and the yield may thereby be improved.

Third Embodiment

Figure 12:
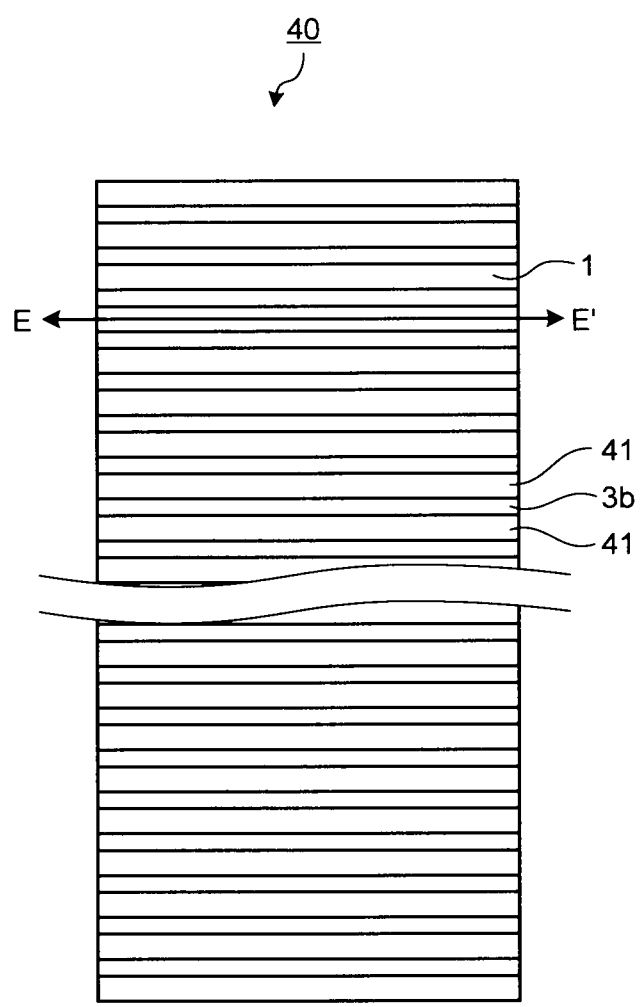
FIG. 12 is a plan view illustrating the schematic structure of a thin-film photoelectric conversion module according to a third embodiment of the present invention.
Figure 13:
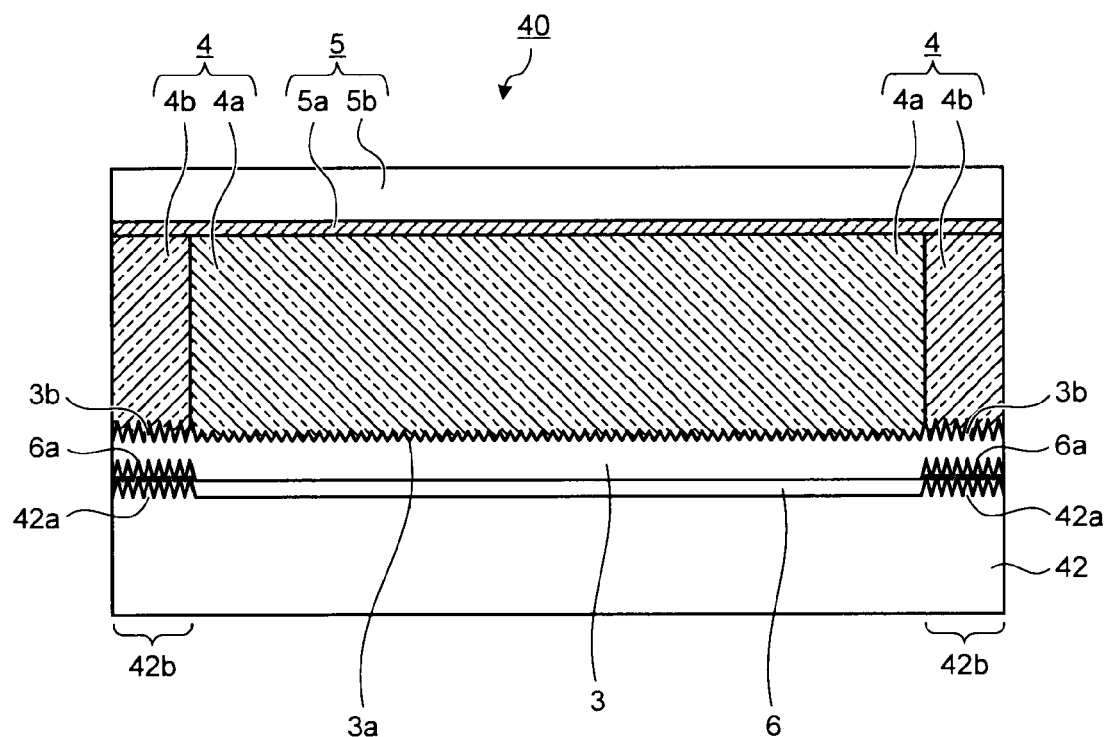
FIG. 13 is a cross-sectional view taken along line segment E-E' in FIG. 12, illustrating the longitudinal cross-sectional structure of a unit photoelectric conversion cell constituting the thin-film photoelectric conversion module according to the third embodiment of the present invention.
Figure 14:
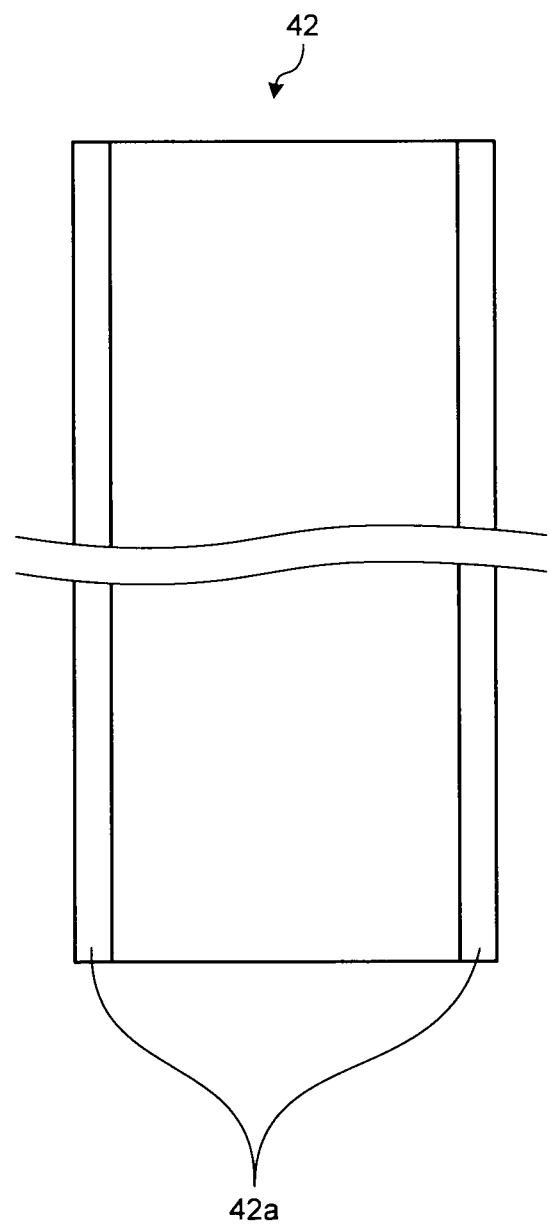
FIG. 14 is a plan view illustrating an insulating light-transmitting substrate 42 used in the thin-film photoelectric conversion module according to the third embodiment of the present invention.

FIG. 12 is a plan view illustrating the schematic structure of a thin-film photoelectric conversion module (hereinafter referred to as a module) 40 of a thin-film photoelectric converter according to a third embodiment of the present invention. FIG. 13 is a cross-sectional view taken along line segment E-E' in FIG. 12, illustrating the longitudinal cross-sectional structure of a unit cell 41 constituting the module 40. FIG. 14 is a plan view illustrating an insulating light-transmitting substrate 42 used in the module 40 according to the third embodiment. In the following figures, the same components as those in FIGS. 1 to 3 are denoted by the same reference numerals.

As illustrated in FIGS. 12 and 13, the module 40 according to the third embodiment includes a plurality of strip-shaped (rectangular) unit cells 41 and has a structure in which these unit cells 41 are connected in series. The module 40 has the same structure as the module 10 of the first embodiment except that the insulating light-transmitting substrate 42 provided instead of the insulating light-transmitting substrate 2 has irregular regions 42b which are disposed in edge regions in the extending direction of the third grooves 9 (edge regions extending in the longitudinal direction of the substrate) and on which large irregularities 42a are formed, as illustrated in FIG. 14, and that the undercoat layer 6 has large irregularities 6a that are formed above the irregular regions 42b so as to follow the shape of the large irregularities 42a. More specifically, each of the unit cells 41 has a structure in which the undercoat layer 6, the transparent electrode layer 3, the photoelectric conversion layer 4, and the rear-side electrode layer 5 are formed in that order on the insulating light-transmitting substrate 42. Therefore, in the following description of the module 40, the insulating light-transmitting substrate 42 and the undercoat layer 6, which make differences from the module 10, will be mainly described.

The transparent electrode layer 3 has a surface texture structure in which surface irregularities are formed, as in the module 10. The transparent electrode layer 3 has regions with different degrees of irregularities (surface roughness) that include regions having large irregularities 3b formed thereon (regions with large surface roughness) and other regions, i.e., regions having small irregularities 3a formed thereon (regions with small surface roughness). In the cross-sectional structure in the longitudinal direction of the unit cells 41, the regions having the large irregularities 3b formed thereon (the regions with large surface roughness) are disposed on the irregular regions 42b of the insulating light-transmitting substrate 42 that have the large irregularities 42a formed thereon, as illustrated in FIG. 13.

Figures 1, 15:
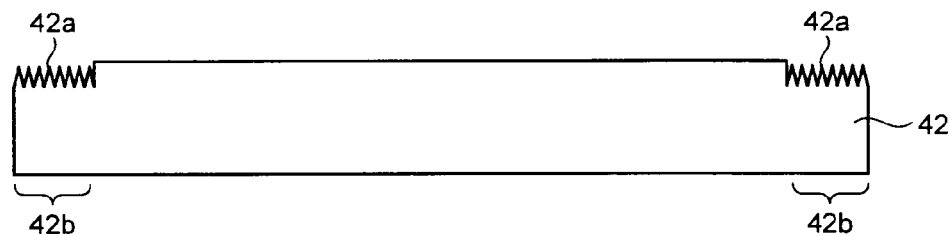
Figures 2, 15:
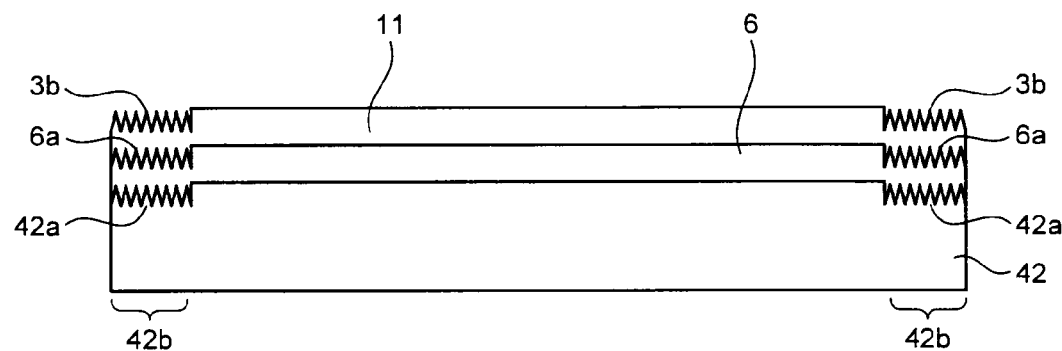
Figures 3, 15:
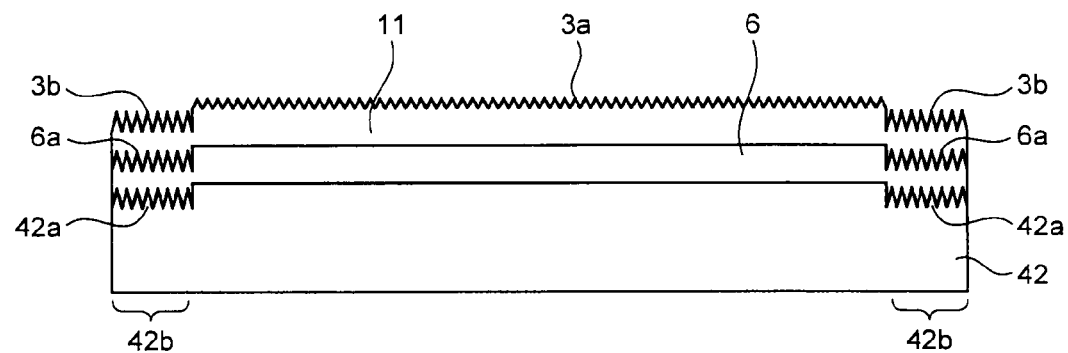

Next, a method for manufacturing the module 40 of the thin-film photoelectric converter according to the third embodiment configured as above will be explained. FIGS. 15-1 to 15-3 are cross-sectional views taken along line segment E-E' in FIG. 12, illustrating an example of the method for manufacturing the module 40.

First, the insulating light-transmitting substrate 42 is prepared. In this instance, a flat white glass plate is used as the insulating light-transmitting substrate 42. Then, the large irregularities 42a are formed on the edge regions that extends in the longitudinal direction of the insulating light-transmitting substrate 42 to form the irregular regions 42b, as illustrated in FIG. 15-1. The large irregularities 42a are formed by grinding, for example, sandblasting, the edge regions that extends in the longitudinal direction of the insulating light-transmitting substrate 42. The irregularities may be formed by immersing only the edge regions that extends in the longitudinal direction of the insulating light-transmitting substrate 42 in a solution that can etch glass, for example, an aqueous hydrofluoric acid solution.

Next, as illustrated in FIG. 15-2, a SiO$_2$ film serving as the undercoat layer 6 is deposited by, for example, sputtering on the surface of the insulating light-transmitting substrate 42 on which the large irregularities 42a have been formed. The irregular shape of the large irregularities 42a on the irregular regions 42b has an influence on regions above the irregular regions 42b of the insulating light-transmitting substrate 42. Therefore, the large irregularities 6a is also formed on the surface of the undercoat layer 6.

Next, as illustrated in FIG. 15-2, a ZnO film serving as the transparent conductive film 11 that forms the transparent electrode layer 3 is formed by sputtering. Since the irregular shape of the large irregularities 6a has an influence on regions above the regions of the undercoat layer 6 that have the large irregularities 6a formed thereon, i.e., regions above the irregular regions 42b of the insulating light-transmitting substrate 42, large irregularities 3b are also formed on the surface of the transparent conductive film 11.

In addition to the ZnO film, any of transparent conductive oxide films such as ITO and SnO$_2$ films and films prepared by adding a metal such as Al to these transparent conductive oxide films to improve conductivity may be used as the material for the transparent conductive film 11. Any other deposition method such as CVD may be used.

Subsequently the surface of the transparent conductive film 11 is etched with dilute hydrochloric acid to roughen the surface. During etching of the surface of the transparent conductive film 11 with dilute hydrochloric acid, small irregularities 3a are formed on the flat portions of the transparent conductive film 11 to create surface roughness, as illustrated in FIG. 15-3. In the portions in which the large irregularities 3b have already been formed to create rough surface, the magnitude of the large irregularities 3b is further increased, and the surface roughness is thereby further increased.

Then the same procedure as that in FIG. 4-3 and subsequent figures for the module 10 is followed to obtain the module 40 illustrated in FIGS. 12 and 13.

As described above, also in the thin-film photoelectric converter according to the third embodiment that uses the insulating light-transmitting substrate 42 in which the large irregularities 42a are formed in the edge regions in the extending direction of the third grooves 9, all the side wall portions of the photoelectric conversion layer 4 are formed of the amorphous film which is less likely to be oxidized than the microcrystalline film and in which the diffusivity of impurities such as oxygen is low. The ingress of oxygen into the photoelectric conversion layer 4 due to oxidation may thereby be prevented. Therefore, in the thin-film photoelectric converter according to the third embodiment in which microcrystalline silicon is used for the photoelectric conversion layer 4, a reduction in the photoelectric conversion efficiency due to the ingress of impurities into the photoelectric conversion layer 4 is prevented, and deterioration in long-term use may thereby be prevented. This provides an advantageous effect in that the long-term reliability of the thin-film photoelectric converter may be improved, which is not achieved in the conventional technology. In addition, the ingress of impurities, water, etc. into the photoelectric conversion layer 4 processed by irradiation with a laser beam during manufacturing can be prevented, and the yield can thereby be improved.

INDUSTRIAL APPLICABILITY

As described above, the thin-film photoelectric converter according to the present invention is useful as a thin-film photoelectric converter in which a microcrystalline film is used in the photoelectric conversion layer.

EXPLANATIONS OF LETTERS OR NUMERALS

1 Unit thin-film photoelectric conversion cell (unit cell)
2 Insulating light-transmitting substrate
3 Transparent electrode layer
3a Small irregularities
3b Large irregularities
4 Photoelectric conversion layer
4a Microcrystalline structure layer
4b Amorphous structure layer
5 Rear-side electrode layer
5a Transparent conductive metal compound layer
5b Metal layer
6 Undercoat layer
6a Large irregularities 6a
7 First groove
8 Second groove
9 Third groove
10 Thin-film photoelectric conversion module
11 Transparent conductive film
12 Etching resist film
20 Thin-film photoelectric conversion module
21 Unit thin-film photoelectric conversion cell (unit cell)
23 Metal film
23b Large irregularities
31 Metal film
40 Thin-film photoelectric conversion module
41 Unit thin-film photoelectric conversion cell (unit cell)
42 Insulating light-transmitting substrate
42a Large irregularities
42b Irregular region

The invention claimed is:
1. A thin-film photoelectric converter comprising:
a first electrode layer formed of a transparent conductive material and whose surface includes first irregularities and second irregularities having a roughness larger than the first irregularities;
a photoelectric conversion layer having a PN junction or a PIN junction for photoelectric conversion; and
a second electrode layer formed of a conductive material that reflects light stacked in that order on an insulating light-transmitting substrate, wherein
the photoelectric conversion layer and the second electrode layer are divided by dividing grooves into islands that form a plurality of photoelectric conversion cells separated from each other,
adjacent ones of the plurality of photoelectric conversion cells are separated by the dividing grooves and electrically connected in series,
the photoelectric conversion layer comprises:
a first semiconductor layer including a microcrystalline structure having the PN junction or the PIN junction and formed in a first region; and
a second semiconductor layer formed of an amorphous structure having the PN junction or the PIN junction and formed in a second region surrounding the first region, the second semiconductor layer being disposed so as to surround all side wall portions of the first semiconductor layer, the first semiconductor layer is partially provided on the first irregularities, the second semiconductor layer is provided directly on the second irregularities, and peripheral regions of the second irregularities are directly between the second semiconductor layer and the insulating light-transmitting substrate.

2. The thin-film photoelectric converter according to claim 1, wherein the first semiconductor layer is a microcrystalline silicon film, and the second semiconductor layer is an amorphous silicon film.

3. The thin-film photoelectric converter according to claim 1, wherein the first semiconductor layer is formed by stacking a p-type microcrystalline silicon film, an i-type microcrystalline silicon film, and an n-type microcrystalline silicon film, and the second semiconductor layer is configured to surround entire peripheral portions of the p-type microcrystalline silicon film, the i-type microcrystalline silicon film, and the n-type microcrystalline silicon film.

4. The thin-film photoelectric converter according to claim 1, wherein the first semiconductor layer is formed by stacking a p-type amorphous silicon film, an i-type amorphous silicon film, an n-type amorphous silicon film, a p-type microcrystalline silicon film, an i-type microcrystalline silicon film, and an n-type microcrystalline silicon film, and the second semiconductor layer is configured to surround entire peripheral portions of the p-type amorphous silicon film, the i-type amorphous silicon film, the n-type amorphous silicon film, the p-type microcrystalline silicon film, the i-type microcrystalline silicon film, and the n-type microcrystalline silicon film.

5. The thin-film photoelectric converter according to claim 1, wherein a surface roughness of the first electrode layer is larger in the second region than in the first region.

6. The thin-film photoelectric converter according to claim 5, wherein the first electrode layer includes a metal layer, and a surface roughness of the metal layer is larger in the second region than in the first region.

7. The thin-film photoelectric converter according to claim 1, wherein in the insulating light-transmitting substrate, a surface roughness of an edge region in an extending direction of the dividing grooves is larger than a surface roughness of other regions.

8. The thin-film photoelectric converter according to claim 1, wherein the insulating light-transmitting substrate is flat.

* * * * *